(12) United States Patent
Hsu et al.

(10) Patent No.: US 6,368,960 B1
(45) Date of Patent: Apr. 9, 2002

(54) DOUBLE SIDEWALL RAISED SILICIDED SOURCE/DRAIN CMOS TRANSISTOR

(75) Inventors: Sheng Teng Hsu, Camas; Jer-Shen Maa, Vancouver, both of WA (US)

(73) Assignees: Sharp Laboratories of America, Inc., Camas, WA (US); Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/113,667

(22) Filed: Jul. 10, 1998

(51) Int. Cl.$^7$ .............................. H01L 21/336
(52) U.S. Cl. ................... 438/649; 438/655; 438/664; 438/682; 438/154; 438/230; 438/233; 438/303; 438/586
(58) Field of Search .................. 438/297, 300, 438/303, 586, 920, 966, 305, 154, 230, 233, 682, 664, 649, 655

(56) References Cited

U.S. PATENT DOCUMENTS

| 5,365,111 | A | | 11/1994 | Ramaswami et al. | ....... 257/768 |
|---|---|---|---|---|---|
| 5,464,782 | A | | 11/1995 | Koh | .............................. 437/41 |
| 5,648,287 | A | * | 7/1997 | Tsai | .............................. 437/44 |
| 5,691,212 | A | * | 11/1997 | Tsai | .............................. 437/24 |
| 5,733,803 | A | | 3/1998 | Mueller | ...................... 438/154 |

FOREIGN PATENT DOCUMENTS

| EP | 0 480 446 A2 | 4/1992 |
|---|---|---|
| EP | 0 766 305 A2 | 4/1992 |
| EP | 07030104 | 1/1995 |
| WO | WO 98/35380 | 8/1998 |

* cited by examiner

*Primary Examiner*—Mary Wilczewski
(74) *Attorney, Agent, or Firm*—David C. Ripma; Matthew D. Rabdau; Scott C. Krieger

(57) ABSTRACT

A method of forming a silicided device includes preparing a substrate by forming device areas thereon; providing structures that are located between the substrate and any silicide layers; forming a first layer of a first reactive material over the formed structures; providing insulating regions in selected portions of the structure; forming a second layer of a second reactive material over the insulating regions and the first layer of first reactive material; reacting the first and second reactive materials to form silicide layers; removing any un-reacted reactive material; forming structures that are located on the silicide layers; and metallizing the device.

6 Claims, 3 Drawing Sheets

DOUBLE SIDEWALL RAISED SILICIDED SOURCE/DRAIN CMOS TRANSISTOR

FIELD OF THE INVENTION

This invention relates to high performance CMOS formed on SIMOX and MOS transistors having very short channel length with shallow source and drain regions.

BACKGROUND OF THE INVENTION

MOS circuits generally use a refractory metal, or silicide of a refractory metal, as a barrier, a conducting media, or an intermediate layer. Refractory metals and their silicides have relative low resistivities and low contact resistances and are desirable as conducting films and layers. Known salicide processes, however, fail to work on deep sub-micron MOS transistors because such processes generally consumes too much silicon. Additionally, impurities and problems achieving uniform deposition of silicide layers create manufacturing problems. Selective epitaxial deposition of silicon or selective deposition of polysilicon requires specialized manufacturing equipment. In addition, the selectivity of the salicide process is strongly dependant on the surface condition of the annealed film.

SUMMARY OF THE INVENTION

The method of the invention for forming a silicided device includes preparing a substrate by forming device areas thereon; providing structures that are located between the substrate and any silicide layers; forming a first layer of a first reactive material over the formed structures; providing insulating regions in selected portions of the structure; forming a second layer of a second reactive material over the insulating regions and the first layer of first reactive material; reacting the first and second reactive materials to form silicide layers; removing any un-reacted reactive material; forming structures that are located on the silicide layers; and metallizing the device.

It is an object of this invention to develop a simple, reliable, and cost effective salicide CMOS process/structure for very high density very small geometry circuit fabrication.

DETAILED DESCRIPTION OF THE PREFERRED EMBODIMENTS

The structure and the process of fabricating the structure according to the invention will be described using a SIMOX (Separation by IMplantation of Oxygen) substrate. The same technique may be applied to bulk silicon devices.

Figure 1:
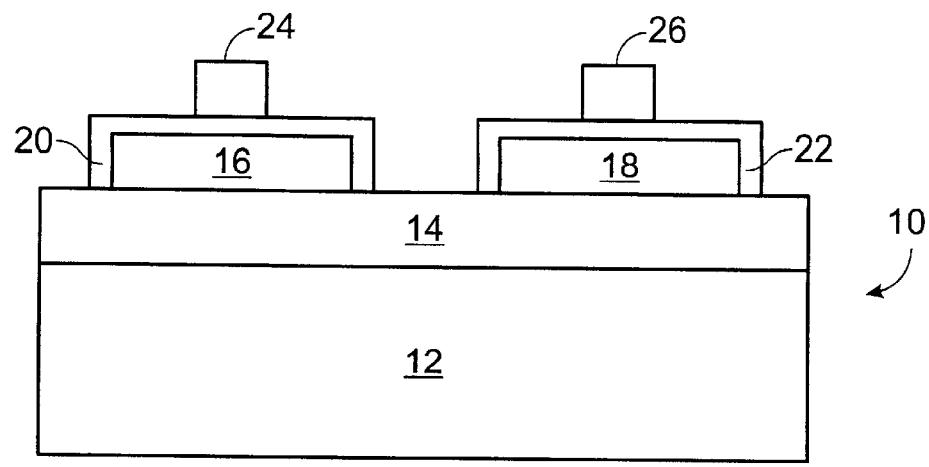
FIG. 1 is a sectional front elevation of the structure following initial wafer preparation and LDD implantation.

The starting material is a SIMOX wafer with very thin superficial silicon film. Referring now to FIG. 1, a portion of a SIMOX wafer is depicted generally at 10. Wafer 10 has a single crystal silicon portion 12, also referred to herein as the substrate. Buried oxide layer 14 has a thickness of between 100 nm and 300 nm, and the silicon film layer has a thickness not greater than 100 nm. The wafer is prepared to form device areas thereon. The structure is treated by active area etching, and threshold voltage adjustment ion implantation. In the case where bulk silicon is used, well diffusion is used, followed by LOCOS or proper isolation formation, threshold voltage adjustment, and ion implantation. In either case, the next step is gate oxidation, polysilicon deposition, gate electrode etching, and LDD ion implantation, to form those structures which are located between the substrate and any silicide layer.

The structure is sketched in FIG. 1, and includes the substrate 12, a buried oxide layer 14, and two silicon regions 16, 18, which are the remnants of the superficial silicon layer. Portions of each silicon region 16, 18 are doped to form N$^+$ regions 16a, 16b, and P$^+$ regions 18a, 18b, respectively, with the central portion of each region remaining as untreated silicon. The doping density of regions 16 and 18 are $1.0 \cdot 10^{16}$ cm$^{-3}$ to $1.0 \cdot 10^{18}$ cm$^{-3}$ of boron and $5.0 \cdot 10^{15}$ cm$^{-3}$ to $5.0 \cdot 10^{17}$ cm$^{-3}$ of boron, respectively. The doping density of the N$^+$ regions is $1.0 \cdot 10^{18}$ cm$^{-3}$ to $5.0 \cdot 10^{19}$ cm$^{-3}$ of As or phosphorous. The doping density of the P$^+$ regions is $1.0 \cdot 10^{18}$ cm$^{-3}$ to $5.0 \cdot 10^{19}$ cm$^{-3}$ of boron. Silicon regions 16, 18 are surrounded by oxide caps 20, 22, respectively. Gate polysilicon regions 24, 26 are located above silicon regions 16, 18, respectively. The preceding steps may be achieved with any state-of-the-art process.

Figure 2:
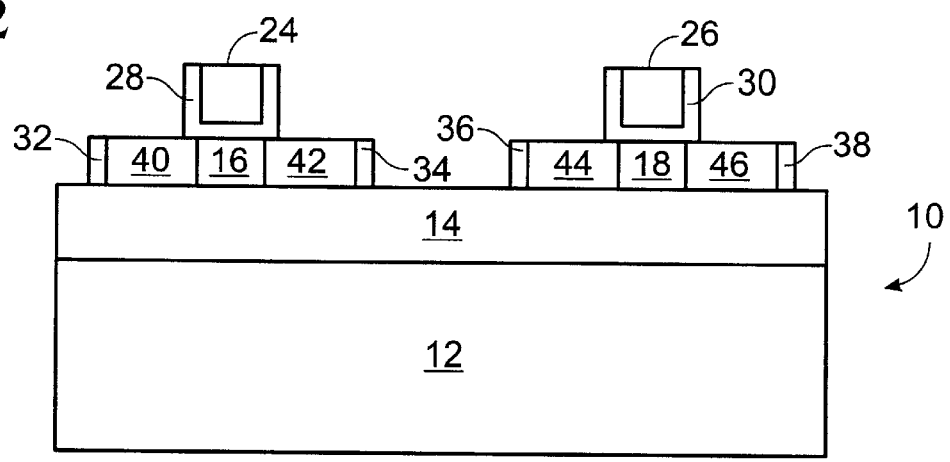
FIG. 2 is a sectional front elevation of the structure following formation of N$^+$ and P$^+$ regions.

A layer of silicon oxide or silicon nitride is deposited, which layer functions as an insulator, over the entire substrate. The thickness of this insulating layer is between 50 nm to 100 nm. In the embodiment described herein, silicon oxide is used. The structure is plasma etched, and now referring to FIG. 2, to remove the upper portions of the insulating layer oxide layer, leaving oxide at the sidewall of gate electrodes 24, 26, which, combined with the remains of oxide caps 20, 22, forms oxide cups 28, 30, and oxide sidewalls, 32, 34, 36 and 38 at the ends of silicon regions 16, 18.

A portion of the structure is covered with photoresist for N$^+$ and P$^+$ source/drain ion implantation for the nMOS and pMOS, respectively. N$^+$ and P$^+$ source/drain ions, i.e., As ions for the N$^+$ regions and BF$_2$ ions for the P$^+$ regions, are implanted at an energy level of 10 keV to 60 keV and a dose of $1.0 \cdot 10^{15}$ cm-2 to $5 \cdot 10^{15}$ cm$^{-2}$ for the N$^+$ region, and an energy level of 10 keV to 60 keV and a dose of $1 \cdot 10^{15}$ cm$^{-2}$ to $5.0 \cdot 10^{15}$ cm$^{-2}$ for the P$^+$ region, forming N$^+$ regions 40, 42 and P$^+$ regions 44, 46, which will ultimately become the source/drain regions of the devices. The gate polysilicon prevents implantation of ions in the area directly beneath the gate polysilicon, which remains in their original state as silicon regions 16, 18. Silicon regions 16 and 18 are LDD regions, while regions 40, 46 are source regions and regions 42, 44 are drain regions.

Figure 3:
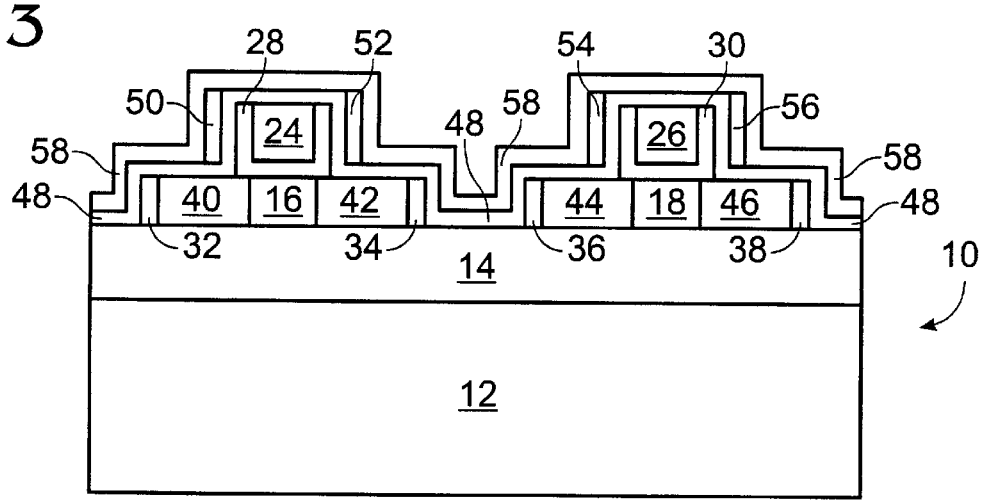
FIG. 3 is a sectional front elevation of the structure following deposition of a refractory metal layer.

Referring now to FIG. 3, a first layer 48 of a first reactive material is deposited over the already formed structures, followed by the formation of insulating regions 50, 52, 54 and 56 in selective portions of the structure, and the deposition of a second layer 58 of a second reactive material. In the first embodiment, first layer 48 is a thin layer of polysilicon, which is deposited over the entire structure to a thickness of between 50 nm to 100 nm. A layer of silicon oxide or silicon nitride is deposited to form insulating regions to a thickness of between 50 nm to 100 nm. Alternately, the oxide layer may be formed by a thermal process, to a thickness of 10 nm to 50 nm. The oxide or nitride layer is plasma etched to form oxide or nitride strips 50, 52, 54 and 56 at the sidewalls of gate electrode 24, 26, respectively. Second layer 58 is formed of a thin layer of refractory metal. which is deposited by CVD or sputtering. The refractory metal may be Co, Ti, Ni, and Pt, and is deposited to a thickness of between 5 nm and 50 nm.

Figure 4:
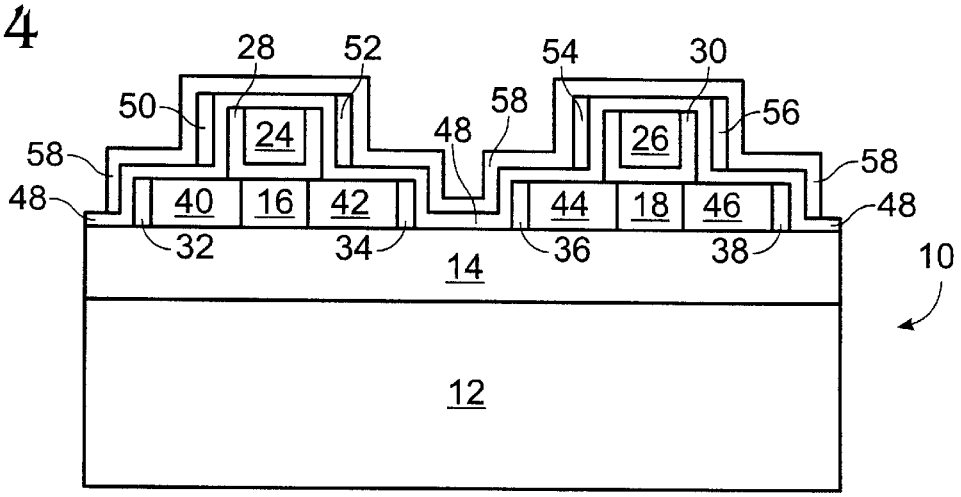
FIG. 4 is a sectional front elevation of the structure following etching of the refractory metal layer.
Figure 5:
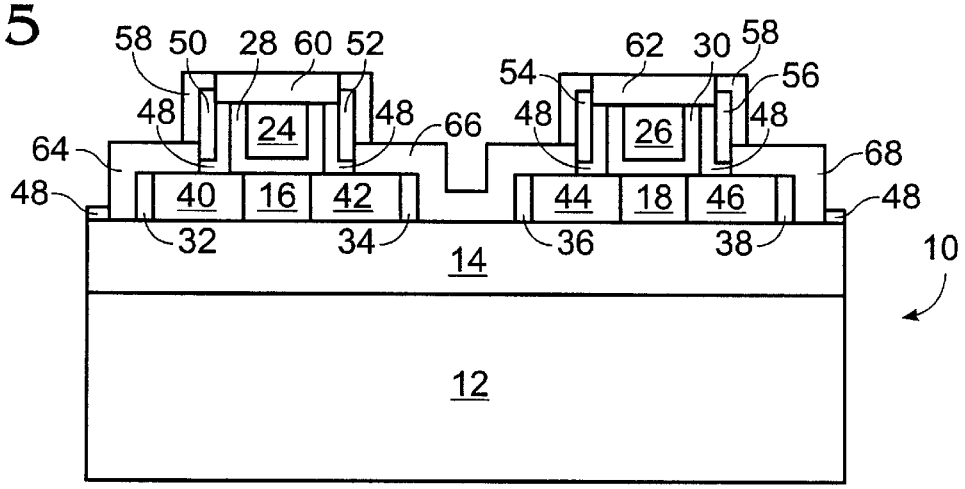
FIG. 5 is a sectional front elevation of the structure following silicidation.

The structure is covered with photoresist, and the refractory metal is etched out of the areas which will not have silicide located therein, as shown in FIG. 4. Silicidation takes place as a reaction between the refractory metal and the silicon during rapid thermal annealing (RTA) at a temperature of between 500° C. to 900° C. for 10 to 50 second, resulting in the formation of silicide layers 60, 62, 64, 66 and 68, as shown in FIG. 5.

Figure 6:
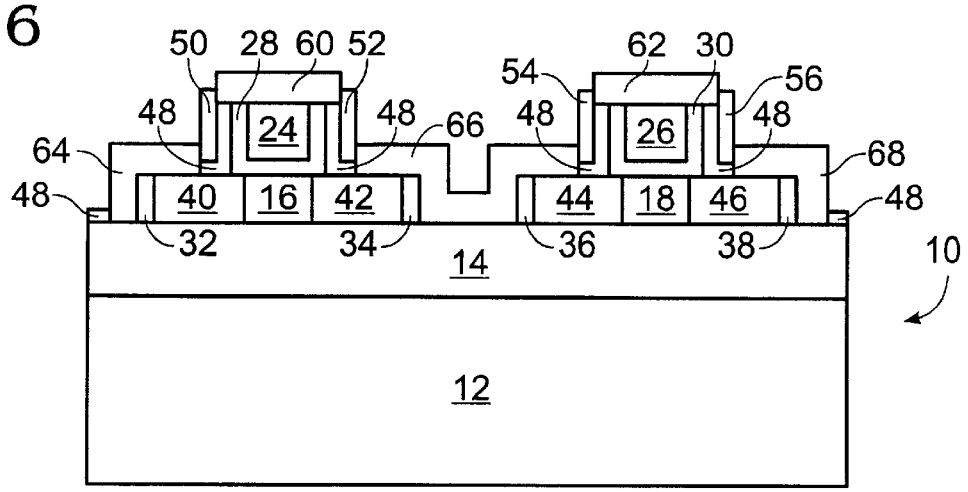
FIG. 6 is a sectional front elevation of the structure following selective etching of un-reacted refractory metal.

The un-reacted refractory metal is removed by selective etching, with a solution such as $NH_4OH+H_2O_2+H_2O$ for Ti, $HNO_3+HCl$ for Pt and $HCl+H_2O_2$ for Ni or Co, resulting in the configuration shown in FIG. 6.

Figure 7:
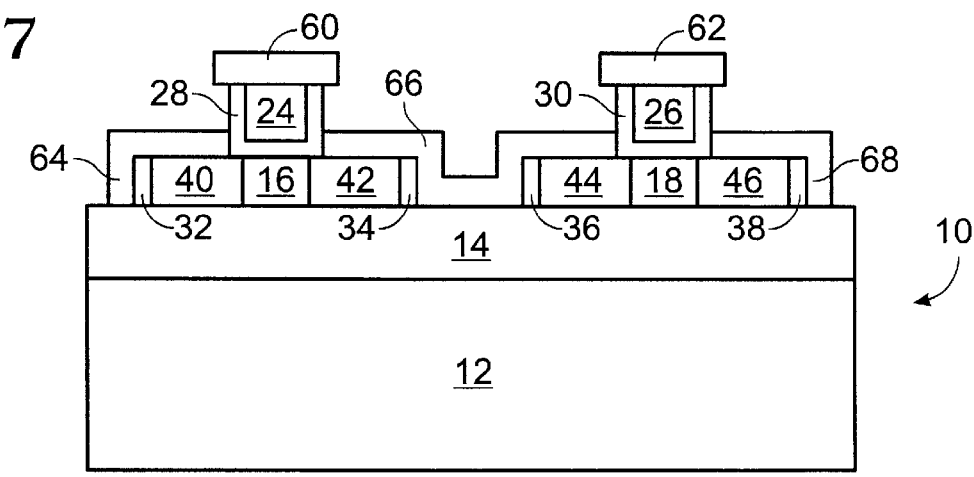
FIG. 7 is a sectional front elevation of the structure following selective etching of oxide and polysilicon layers.

The remaining oxide is selective etched in a diluted BHF solution, and the polysilicon is selectively etched in an $HNO_3:H_2O_2:H_2O$ solution, resulting in the configuration shown in FIG. 7. It should be noted that silicide layers 60, 62, located on the top of gate polysilicon 24, 26 has an overhang. Because the thickness of the polysilicon is no thicker than 100 nm, the overhang is less than 100 nm. Therefore, there is, with proper quality control in the manufacturing process, no step coverage problem.

Figure 8:
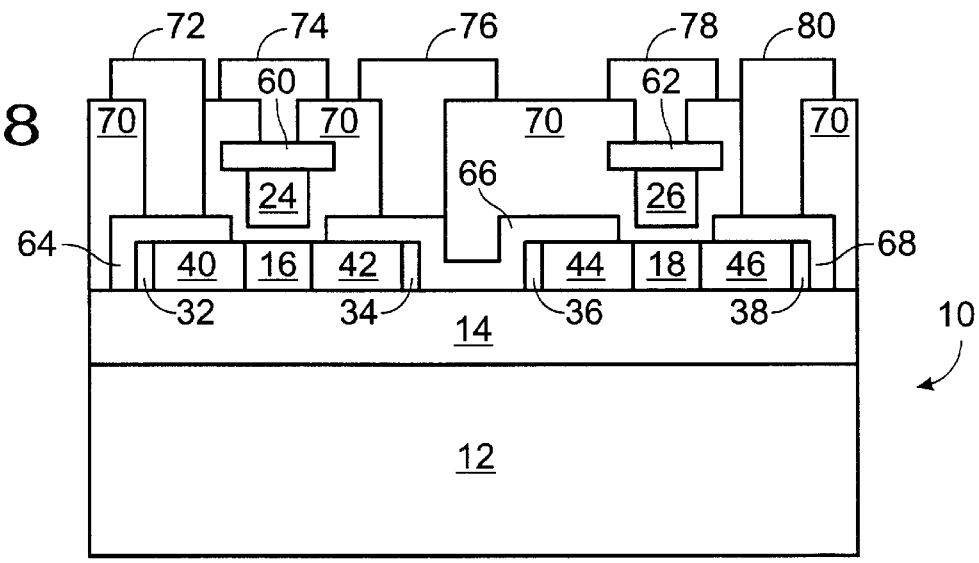
FIG. 8 is a sectional front elevation of the completed structure.

Follow the state of the art process to complete the device fabrication to form any structures which are located on a silicide layer, above, or along side of a silicide layer, and which has not already been formed. The structure is covered with oxide 70 by CVD to a thickness of between 400 nm and 600 nm. Oxide layer 70 joins with oxide cups 28, 30. The structure is etched to form bores for metallization, and metal is deposited to form source electrode 72, gate electrode 74, combined drain electrode 76, gate electrode 78 and source electrode 80. A cross-sectional view of the finished CMOS pair is shown in FIG. 8.

In an alternate form of the invention, the refractory metal is deposited as the first reactive layer, the sidewall insulators formed, and a layer of polysilicon deposited as the second reactive layer. Portions of the second reactive layer, polysilicon in this case, is selectively etched, as in FIG. 4. Silicidation follows, and then selective etching of polysilicon and the refractory metal.

If the refractory metal is Ni, Co or Pt, a thin layer of Ti may be deposited on top of the initial metal layer. The thickness of Ti layer may be very thin such as 5 nm to 20 nm. The wafer is then exposed to air to convert Ti to titanium oxide. If necessary, the wafer is heated to a temperature 40° C. to 250° C. to convert all Ti to titanium oxide. The titanium oxide is plasma etched to form a titanium oxide sidewall at the side wall of the gate electrode. Polysilicon is deposited, photoresist is applied, and the polysilicon is etched out of the area where no silicide is needed. The wafer is then treated to form the silicide layers.

Although a preferred embodiment of the invention, and several variations thereof have been disclosed, it will be appreciated that further modifications and variations may be made thereto within the scope of the invention as defined in the appended claims.

We claim:

1. A method of forming a silicided device, comprising:
    preparing a substrate by forming device areas thereon;
    providing integrated circuit structures on the substrate;
    depositing a layer of a refractory metal over the integrated circuit structures;
    providing insulating regions in selected portions of the structure;
    depositing a layer of polysilicon over the insulating regions and the layer of refractory metal;
    reacting the refractory metal and the polysilicon to form silicide layers, wherein a portion of the refractory metal remains un-reacted;
    removing any un-reacted refractory metal;
    forming integrated circuit structures that are located on the silicide layers; and
    metallizing the device.

2. The method of claim 1 wherein said reacting includes rapid thermally annealing the structure at a temperature of between about 500° C. to 900° C. for a period of about 10 seconds to 50 seconds.

3. The method of claim 1 wherein said depositing a layer of a refractory metal taken from the group of refractory metals consisting of Co and Pt, and which includes depositing a layer of Ti on top of the first layer of first reactive material; and wherein said providing insulating regions in selected portions of the structure includes oxidizing the Ti layer to form $TiO_2$.

4. The method of claim 1 wherein said depositing a layer of a refractory metal includes depositing a refractory metal taken from the group of refractory metals consisting of Ni, Co, Ti and Pt.

5. A method of forming a silicided device, comprising:
    preparing a substrate by forming device areas thereon;
    providing integrated circuit structures on the substrate;
    forming a first layer of a first reactive material over the integrated circuit structures including depositing a layer of a refractory metal taken from the group of refractory metals consisting of Ni, Co, Ti and Pt;
    providing insulating regions in selected portions of the device;
    forming a second layer of a second reactive material over the insulating regions and the first layer of first reactive material wherein said forming a second layer of a second reactive material includes depositing a layer of polysilicon;
    reacting the first reactive material and second reactive material to form silicide layers, wherein a portion of the first and second reactive materials remain un-reacted;
    removing any un-reacted reactive material;
    forming integrated circuit structures on the silicide layers; and
    metallizing the device.

6. A method of forming a silicided device, comprising:
    preparing a substrate by forming device areas thereon;
    providing integrated circuit structures on the substrate;
    forming a first layer of a first reactive material over the integrated circuit structures including depositing a layer of a refractory metal taken from the group of refractory metals consisting of Ni, Co and Pt;
    depositing a layer of Ti on top of the first layer of first reactive material;
    providing insulating regions in selected portions of the device including oxidizing the Ti layer to form TiO2;
    forming a second layer of a second reactive material over the insulating regions and the first layer of first reactive material wherein said forming a second layer of a second reactive material includes depositing a layer of polysilicon;

reacting the first reactive material and second reactive material to form silicide layers, wherein a portion of the first and second reactive materials remain un-reacted;

removing any un-reacted reactive material;

forming integrated circuit structures on the silicide layers; and metallizing the device.

\* \* \* \* \*